(12) United States Patent
Nabrotzky (10) Patent No.: US 9,008,992 B2
(45) Date of Patent: Apr. 14, 2015

(54) TESTING AND MONITORING AN ELECTRICAL SYSTEM

(75) Inventor: Edmund Siegfried Nabrotzky, Waterloo (CA)

(73) Assignee: Thomas & Betts International, Inc., Wilmington, DE (US)

( * ) Notice: Subject to any disclaimer, the term of this patent is extended or adjusted under 35 U.S.C. 154(b) by 499 days.

(21) Appl. No.: 13/417,712

(22) Filed: Mar. 12, 2012

(65) Prior Publication Data

US 2012/0245880 A1    Sep. 27, 2012

Related U.S. Application Data

(60) Provisional application No. 61/467,407, filed on Mar. 25, 2011.

(51) Int. Cl.
*G01R 31/08* (2006.01)
*G01R 31/44* (2006.01)

(52) U.S. Cl.
CPC .............. *G01R 31/086* (2013.01); *G01R 31/44* (2013.01)

(58) Field of Classification Search
CPC ...................................... G01R 31/086
USPC ........................................ 702/122
See application file for complete search history.

(56) References Cited

U.S. PATENT DOCUMENTS

| | | |
|---|---|---|
| 1,289,183 A | 12/1918 | Jerram |
| 2,071,405 A | 2/1937 | Jahnel |
| 2,133,047 A | 10/1938 | Sheldon |
| 2,140,759 A | 12/1938 | Muller |
| 2,149,860 A | 3/1939 | Morrell |
| 2,173,803 A | 9/1939 | Gammeter |
| 2,277,589 A | 3/1942 | Hanson |
| 2,347,483 A | 4/1944 | Katcher |
| 2,493,057 A | 1/1950 | Billgren |
| 2,519,455 A | 8/1950 | Haantjes |
| 2,597,342 A | 5/1952 | Lang |
| 3,715,741 A | 2/1973 | McWade et al. |
| 3,829,735 A | 8/1974 | Berlock et al. |
| 3,842,343 A | 10/1974 | Taylor et al. |
| 4,295,079 A | 10/1981 | Otsuka et al. |
| 4,297,632 A | 10/1981 | Glaser et al. |
| 4,330,778 A | 5/1982 | Yamazaki et al. |
| 4,449,073 A | 5/1984 | Mongoven et al. |
| 4,675,574 A | 6/1987 | Delflache |
| 4,939,505 A | 7/1990 | Cappellini et al. |
| 4,980,645 A | 12/1990 | Soma et al. |
| 5,220,321 A | 6/1993 | Sauer |
| 5,239,236 A | 8/1993 | Backstrom et al. |

(Continued)

FOREIGN PATENT DOCUMENTS

| | | |
|---|---|---|
| CN | 1043394 | 6/1990 |
| CN | 2381092 Y | 5/2000 |

(Continued)

*Primary Examiner* — Bryan Bui
(74) *Attorney, Agent, or Firm* — Snyder, Clark, Lesch & Chung, LLP (57) ABSTRACT

A method includes outputting a test initiation command over a power supply cable to a first load device, receiving, at the first load device, the test initiation command and testing the first load device. The method also includes generating first test data for the first load device, inserting the first test data into a data packet and forwarding the data packet to another load device. The method further includes repeating the inserting and forwarding for each of the load devices.

21 Claims, 7 Drawing Sheets

(56) References Cited

U.S. PATENT DOCUMENTS

| | | |
|---|---|---|
| 5,243,340 A | 9/1993 | Norman et al. |
| 5,276,401 A | 1/1994 | Soma et al. |
| 5,359,325 A | 10/1994 | Ford et al. |
| 5,397,963 A | 3/1995 | Manson |
| 5,426,429 A | 6/1995 | Norman et al. |
| 5,485,151 A | 1/1996 | Runyon et al. |
| 5,638,057 A | 6/1997 | Williams |
| 5,644,304 A | 7/1997 | Pavarotti et al. |
| 5,661,468 A * | 8/1997 | Marcoux ............... 340/7.1 |
| 5,926,115 A | 7/1999 | Schleder et al. |
| 5,969,642 A | 10/1999 | Runyon et al. |
| 6,437,686 B2 | 8/2002 | Satoh et al. |
| 6,717,660 B1 | 4/2004 | Bernardo |
| 7,102,540 B2 | 9/2006 | Runyon et al. |
| 8,421,588 B1 * | 4/2013 | Ross et al. ............... 340/5.1 |
| 2007/0233509 A1 * | 10/2007 | Buchman et al. ............... 705/1 |
| 2009/0222223 A1 * | 9/2009 | Walters et al. ............... 702/58 |

FOREIGN PATENT DOCUMENTS

| | | |
|---|---|---|
| CN | 2381092 Y | 5/2000 |
| CN | 1450842 | 10/2003 |
| CN | 1945647 | 4/2007 |
| CN | 101702851 | 5/2010 |
| CN | 101702851 A | 5/2010 |
| EP | 0677748 | 10/1995 |
| WO | 9714272 A1 | 4/1997 |
| WO | 0024229 A1 | 4/2000 |
| WO | 2006077478 A2 | 7/2006 |
| WO | 2007140779 A1 | 12/2007 |
| WO | 2009047261 A2 | 4/2009 |
| WO | 2009074913 A1 | 6/2009 |
| WO | 2010049224 A2 | 5/2010 |
| WO | 2010/094621 | 8/2010 |

* cited by examiner

FIG. 7

TESTING AND MONITORING AN ELECTRICAL SYSTEM

RELATED APPLICATION

This application claims priority under 35 U.S.C. §119 based on U.S. Provisional Patent Application No. 61/467, 407, filed Mar. 25, 2011, the disclosure of which is hereby incorporated herein by reference.

BACKGROUND INFORMATION

An insulation resistance test, commonly known as a Megger test, is often used to determine if insulation or connections on a cable system are degrading. For example, a Megger test may be performed to test a power cable that is serially connected to a number of electrical devices, such as lights. One drawback with using such a conventional test is that the test may indicate that there is a problem on the system, but the test is unable to indicate which segment of the cable has a problem. When the cable system spans a long distance, an electrician may take hours to identify the source of the problem through a number of manual interventions and test break points.

An impedance test may also be performed using a Time Domain Reflectometer/Reflectometry (TDR). A TDR test transmits a short rise time pulse along a conductor. If the conductor is of uniform impedance and is properly terminated, the entire transmitted pulse will be absorbed in the far-end termination and no signal will be reflected toward the TDR. Any impedance discontinuities will cause some of the incident signal to be sent back toward the source. The resulting reflected pulse that is measured at the output/input to the TDR is displayed or plotted as a function of time and, because the speed of signal propagation is almost constant for a given transmission medium, can be read as a function of cable length. One of the drawbacks of this test is that in a medium that is not uniform (i.e., many splices exist, transformers are connected in series, etc.), the reflected pulse cannot be used to accurately assess a cable fault.

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

Embodiments described herein provide a system that enables tests to be performed on electrical devices and a power cable interconnecting the electrical devices. For example, in one embodiment, a test on a number of light fixtures that are serially connected to one another may be initiated from a central testing/monitoring device. Each light fixture may receive the test initiation signal, perform various tests in response to the signal and insert test data into a packet or on a carrier signal that will return to the central testing/monitoring device. Based on the location within the packet and/or timing of the received test data, the central monitoring device may identify the particular light fixture and/or segment of cable associated with the returned test data.

Figure 1:
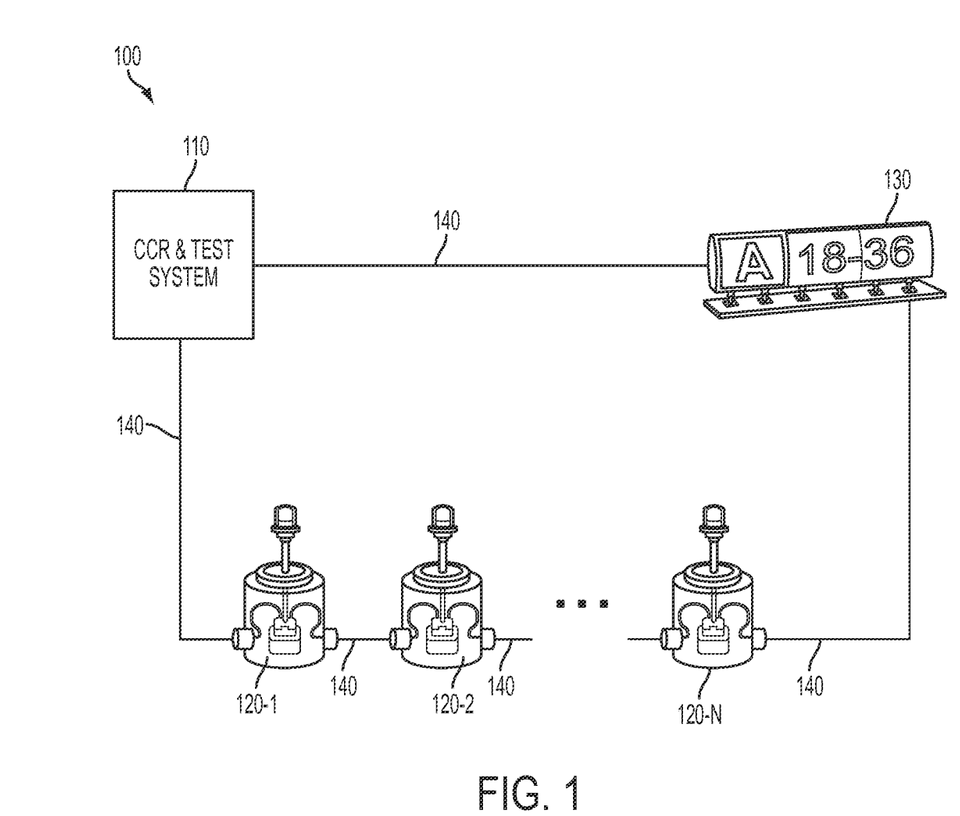
FIG. 1 is a schematic diagram of an exemplary system consistent with an exemplary embodiment.

FIG. 1 is a schematic view of an exemplary system 100 in accordance with an exemplary embodiment. Referring to FIG. 1, system 100 may include constant current regulator (CCR) and test system 110 (also referred to herein as CCR 110 or test system 110), light fixtures/wiring cans 120-1 through 120-N (referred to individually as light fixture 120 or collectively as light fixtures 120), sign 130 and cable 140. The exemplary configuration illustrated in FIG. 1 is provided for simplicity. It should be understood that system 100 may include more or fewer devices than illustrated in FIG. 1.

CCR and test system 110 may provide power to light fixtures 120 and sign 130. For example, CCR 110 may include a transformer and regulator that provide constant current to each of light fixtures 120 and sign 130. CCR 110 and test system 110 may also include circuitry or components that drive communications over cable 140. For example, test system 110 may interpose or multiplex data communications over the same cable (i.e., cable 140) that provides power to light fixtures 120 and sign 130. The data communications may include communications to initiate various tests, such as a Megger test on cable 140, a test to determine the status of a light bulb in light fixtures 120, etc. In some implementations, the data communications may initiate other actions, such as an action to ground one or more of light fixtures 120 via a ground relay included in the light fixture 120, as described in detail below.

Light fixtures 120 may represent light fixtures used in any number of different applications, such as lights used in an airport runway system, lights used in a campus environment, such as a corporate campus or school, etc. Light fixtures 120 may include a wiring "can" or electrical box that includes an isolation transformer and cabling. Light fixtures 120 may also include one or more light bulbs. Sign 130 may represent an airport sign, such as a sign used on a runway that may be lighted to allow for viewing in night time conditions. Sign 130 may also include an isolation transformer (not shown).

Cable 140 may be a power cable that interconnects CCR 110, light fixtures 120 and sign 130 to one another and provides power to each of light fixtures 120 and sign 130. In an exemplary implementation, cable 140 may serially connect CCR 110 to each of light fixtures 120 and sign 130 in, for example, a 500 kilovolt (kV) series circuit. Cable 140 may also be used for communicating signaling to test components of system 100. For example, in accordance with one implementation, CCR 110 may initiate a test over cable 140 that allows test system 110 to receive the test results and identify particular segments of cable 140 and/or particular light fixtures 120 that have problems, as described in detail below.

Figure 2:
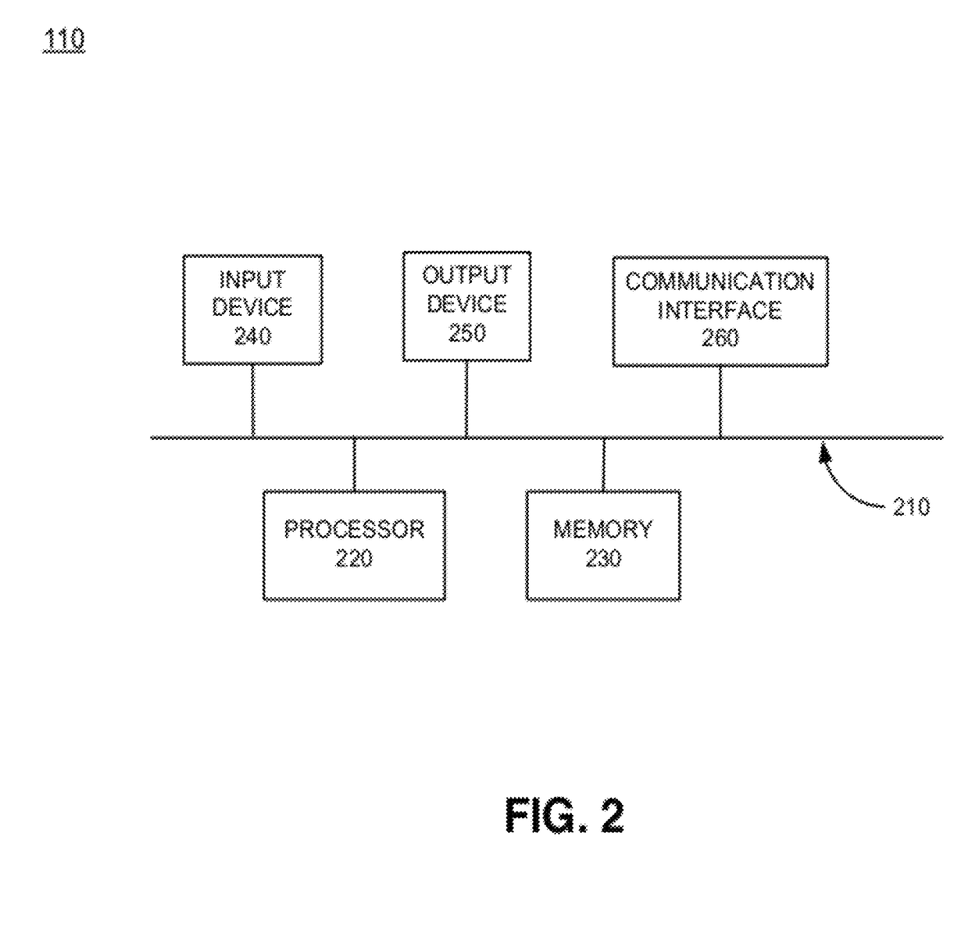
FIG. 2 is a schematic diagram illustrating exemplary components associated with one or more of the devices of FIG. 1.

FIG. 2 is a diagram illustrating components of CCR and test system 110 according to an exemplary implementation. CCR and test system 110 may include bus 210, processor 220, memory 230, input device 240, output device 250 and communication interface 260. Bus 210 permits communication among the components of test system 110. One skilled in the art would recognize that test system 110 may be configured in a number of other ways and may include other or different elements. For example, test system 110 may include one or more modulators, demodulators, encoders, decoders, etc., for processing data. In addition, in some implementations, the components of test system illustrated in FIG. 2 may be located externally from CCR 110. For example, the components illustrated in FIG. 2 may be included in a control device (e.g., a computer, a server, etc). In such implementations, CCR 110 may include an interface, such as an application programming interface (API), that allows the test system components illustrated in FIG. 2 to initiate the test remotely via the API included in CCR 110.

Processor 220 may include a processor, microprocessor, an application specific integrated circuit (ASIC), field programmable gate array (FPGA) or other processing logic. Processor 220 may execute software instructions/programs or data structures to control operation of test system 110.

Memory 230 may include a random access memory (RAM) or another type of dynamic storage device that stores information and instructions for execution by processor 220; a read only memory (ROM) or another type of static storage device that stores static information and instructions for use by processor 220; a flash memory (e.g., an electrically erasable programmable read only memory (EEPROM)) device for storing information and instructions; a hard disk drive (HDD); and/or some other type of magnetic or optical recording medium and its corresponding drive. Memory 230 may also be used to store temporary variables or other intermediate information during execution of instructions by processor 220. Instructions used by processor 220 may also, or alternatively, be stored in another type of computer-readable medium accessible by processor 220. A computer-readable medium may include one or more memory devices.

Input device 240 may include mechanisms that permit an operator to input information to test system 110, such as a keypad, control buttons, a keyboard (e.g., a QWERTY keyboard, a Dvorak keyboard, etc.), a touch screen display that acts as an input device, etc. Output device 250 may include one or more mechanisms that output information to the user, including a display, such as a display, a printer, one or more speakers.

Communication interface 260 may include a transceiver that enables test system 110 to communicate with other devices and/or systems. For example, communication interface 260 may allow data communications or test signals to be transmitted on cable 140. In one implementation, communication interface 260 may transmit a data signal or packet on cable 140 that will be identified by each of light fixtures 120 and sign 130 as a test initiation signal/packet, as described in more detail below. Communication interface may also include a modem or an Ethernet interface to a local area network (LAN). Communication interface 260 may also include mechanisms for communicating via a network, such as a wireless network. For example, communication interface 260 may include one or more radio frequency (RF) transmitters, receivers and/or transceivers and one or more antennas for transmitting and receiving RF data via a network.

Test system 110 may provide a platform for testing system 100, include light fixtures 120, sign 130 and cable 140. Test system 110 may initiate and perform some of these operations in response to processor 220 executing sequences of instructions contained in a computer-readable medium, such as memory 230. Such instructions may be read into memory 230 from another computer-readable medium via, for example, communication interface 260. In alternative embodiments, hard-wired circuitry may be used in place of or in combination with software instructions to implement processes consistent with the invention. Thus, implementations described herein are not limited to any specific combination of hardware circuitry and software.

Figure 3:
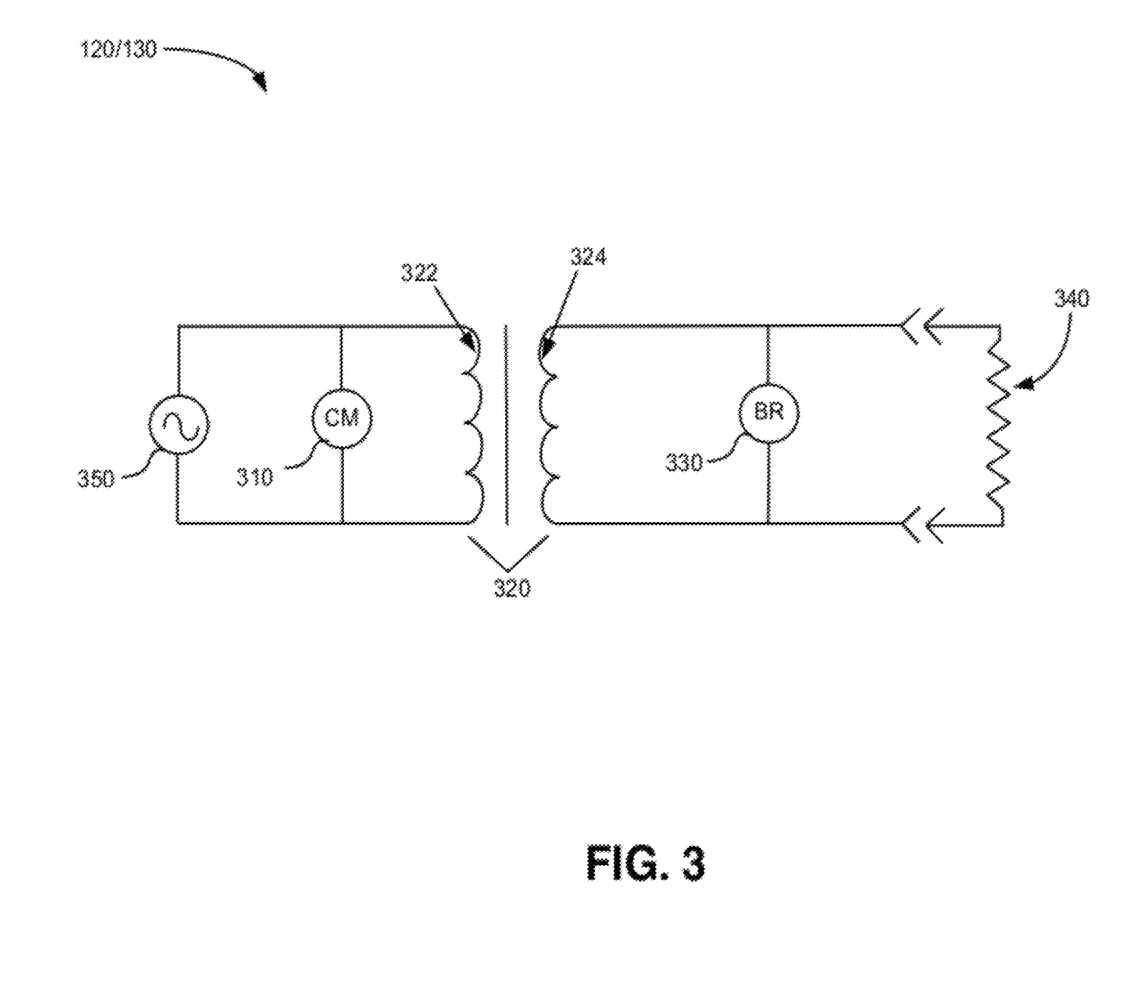
FIG. 3 is a diagram illustrating exemplary components of another one or more of the devices of FIG. 1.

FIG. 3 is a schematic diagram illustrating components involved in monitoring light fixtures 120, sign 130 and/or segments of cable 140. In an exemplary implementation, all or some of these components may be implemented within light fixture 120 and/or sign 130. Referring to FIG. 3, light fixture 120 may include circuit monitor (CM) module 310 (also referred to herein as CM 310), transformer 320, bridge rectifier (BR) 330 and load 340. Power source 350 may represent an alternating current (AC) power source associated with providing power to lighting fixture 120. For example, power source 350 may represent an AC power source that provides constant current to light fixtures 120 and sign 130 via CCR 110. For example, a regulator (not shown) within CCR 110 may ensure that constant current is provided to each load element. CM 310 may be coupled to AC power source 350. For example, CM 310 may be a printed circuit board (PCB) that is provided with power via AC power source 350.

Transformer 320 may be an isolation transformer that includes primary coil 322 and secondary coil 324. CM 310 may be connected in parallel to the primary coil 322. Transformer 320 may provide isolation of power from the source side (e.g., source 350) to the load (e.g., load 340, which may correspond to one or more bulbs in light fixture 120). In some implementations, CM 310 and BR 330 may be integrated into one unit/device and be connected in parallel to the secondary coil 324 of isolation transformer 320.

CM 310 may manage all communications over the primary line and provide unique addressing associated with each of lights 120 and sign 130. CM 310 may also enable Megger testing and TDR testing of cable 140, monitoring the health of secondary coil 324 and fixture 120 and providing isolation on surge or lightning strikes, as described in more detail below. Bridge rectifier (BR) 330 may ensure proper polarity associated with the load (e.g., a light bulb included in light fixture 120). The exemplary configuration illustrated in FIG. 3 is provided for simplicity. It should be understood that lighting fixtures 120 may include more or fewer devices than illustrated in FIG. 3.

Figure 4:
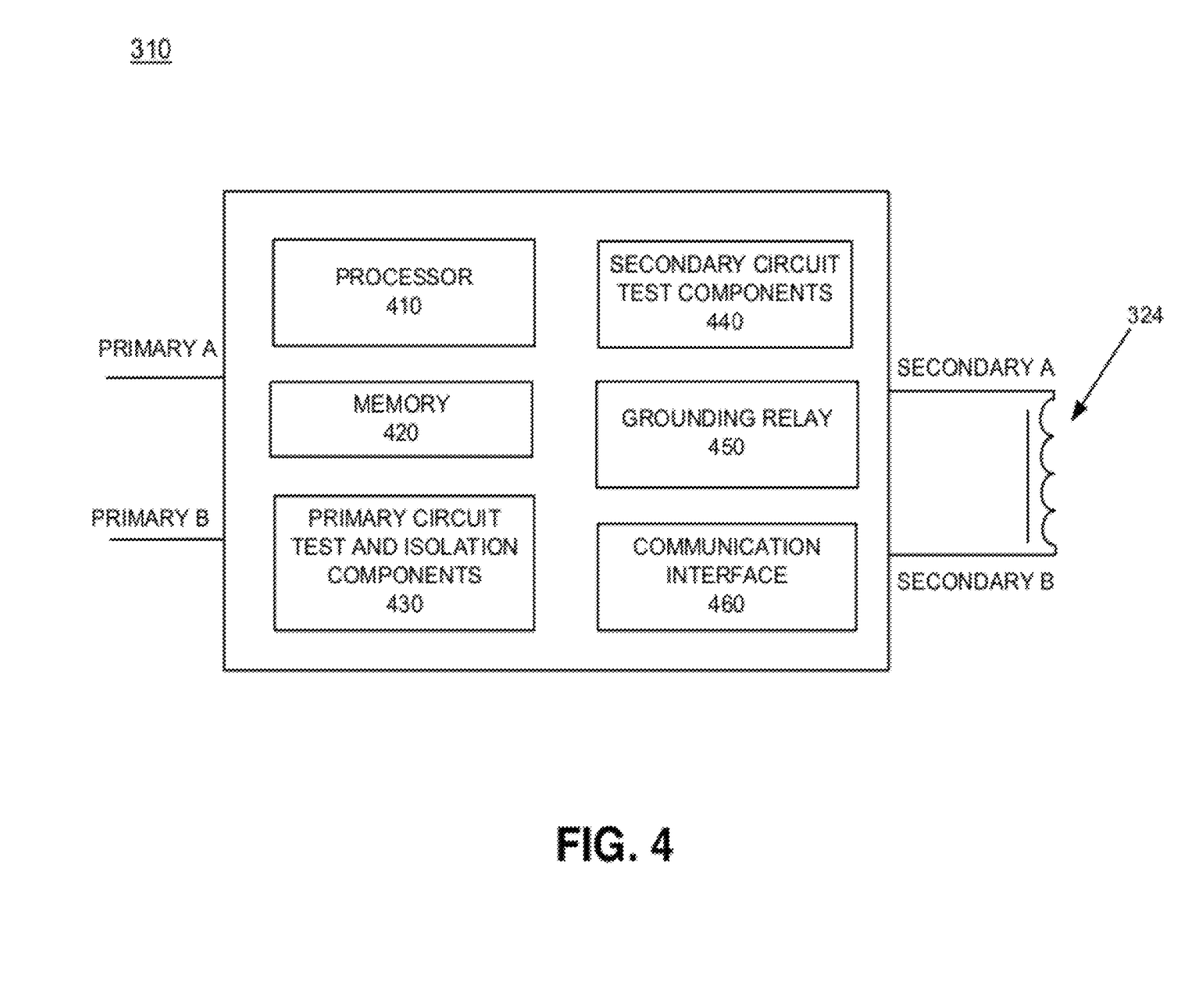
FIG. 4 illustrates exemplary components implemented in the circuit module of FIG. 3.

FIG. 4 illustrates logic components implemented in CM 310 in accordance with an exemplary implementation. Referring to FIG. 4, CM 310 may include processor 410, memory 420, primary circuit test and isolation components 430, secondary circuit test components 440, grounding relay 450 and communication interface 460.

Processor 410 may include a processor, microprocessor, an ASIC, FPGA or other processing logic. Processor 410 may execute software instructions/programs or data structures to control operation of CM 310.

Memory 420 may include a RAM or another type of dynamic storage device that stores information and instructions for execution by processor 410; a ROM or another type of static storage device that stores static information and instructions for use by processor 410; a flash memory (e.g., an EEPROM) device for storing information and instructions; an HDD; and/or some other type of magnetic or optical recording medium and its corresponding drive. Memory 420 may also be used to store temporary variables or other intermediate information during execution of instructions by processor 410. Instructions used by processor 410 may also, or alternatively, be stored in another type of computer-readable medium accessible by processor 410. A computer-readable medium may include one or more memory devices.

Figure 5:
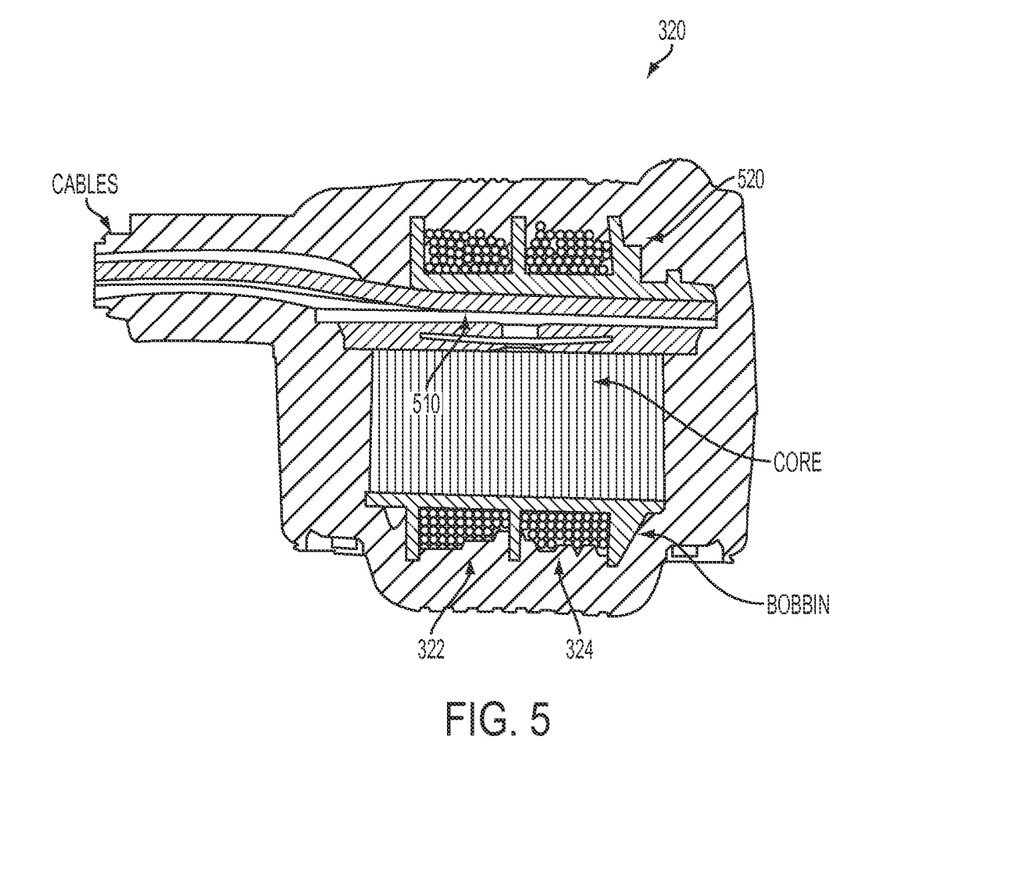
FIG. 5 illustrates the isolation transformer of FIG. 3 in accordance with an exemplary embodiment.

Primary circuit test and isolation components 430 may include devices and/or circuitry to test primary coil 322 to determine whether primary coil 322 has any shorts in the windings or other problems. Primary circuit test and isolation components 430 may also include circuitry to ensure that primary coil 322 is electrically isolated from secondary coil 324. In one implementation, isolation transformer 320 may include a tunnel for routing the secondary winding wire to ensure that the secondary winding has 100% isolation from all components on the primary side. For example, FIG. 5 illustrates a cut away view of isolation transformer 320. Referring to FIG. 5, tunnel 510 is used to route the secondary winding/cable to the load. As also illustrated, air free molding illustrated at area 520 ensures high internal insulation for isolation transformer 320.

Returning to FIG. 4, secondary circuit test components 440 may include logic to monitor the health of the secondary coil 324 and the light bulb/fixture itself. For example, secondary circuit test components 440 may measure voltage and/or current of the secondary line to determine if shorts exist across the windings. Secondary circuit test components 440 may also provide an alarm upon detecting an absence of a load (e.g., bulb failure). Information from secondary circuit and test components 440 may enable a central monitoring system to predict the life of fixture 120. In an exemplary implementation, secondary A and B lines illustrated in FIG. 4 may be passed through an isolating channel under inductive sensors to ensure isolation from the primary side of isolation transformer 320.

Grounding relay 450 may include a high-speed relay that operates to ground light fixture 120 upon detecting a voltage or current spike. For example, upon a lightning strike, a voltage spike may be imparted to cable 140. Grounding relay 450 may sense the voltage spike and ground isolation transformer 320, thereby ensuring that the voltage spike does not cascade on cable 140 to other light fixtures 120. Grounding relay 450 may also be automatically reset after the surge has passed. In addition, grounding relay 450 may include logic to provide a diagnosis and report any damage or degradation after the surge has passed. This diagnosis/report may provide the central monitoring system (e.g., test system 110) with information that may be useful.

Communication interface 460 may include a transceiver that enables CM 310 to communicate with other devices and/or systems. For example, communication interface 460 may receive a test packet/signal from test system 110 or an upstream light fixture 120. In each case, communication interface 460 may forward the packet/signal to processor 410 that identifies the test initiation command. Communication interface 460 may also forward a packet with information associated with the particular light fixture 120 to a downstream light fixture 120 via cable 140. In some implementations, communication interface 460 may include a modem or an Ethernet interface to a LAN. Communication interface 460 may also include mechanisms for communicating via a network, such as a wireless network. For example, communication interface 460 may include one or more radio frequency (RF) transmitters, receivers and/or transceivers and one or more antennas for transmitting and receiving RF data via a network.

CM 310 may provide a platform for testing components of light fixture 120, sign 130 and/or cable 140. CM 310 may perform some or all of these operations in response to processor 410 executing sequences of instructions contained in a computer-readable medium, such as memory 420. Such instructions may be read into memory 420 from another computer-readable medium via, for example, communication interface 460. In alternative embodiments, hard-wired circuitry may be used in place of or in combination with software instructions to implement processes consistent with the invention. Thus, implementations described herein are not limited to any specific combination of hardware circuitry and software.

Figure 6:
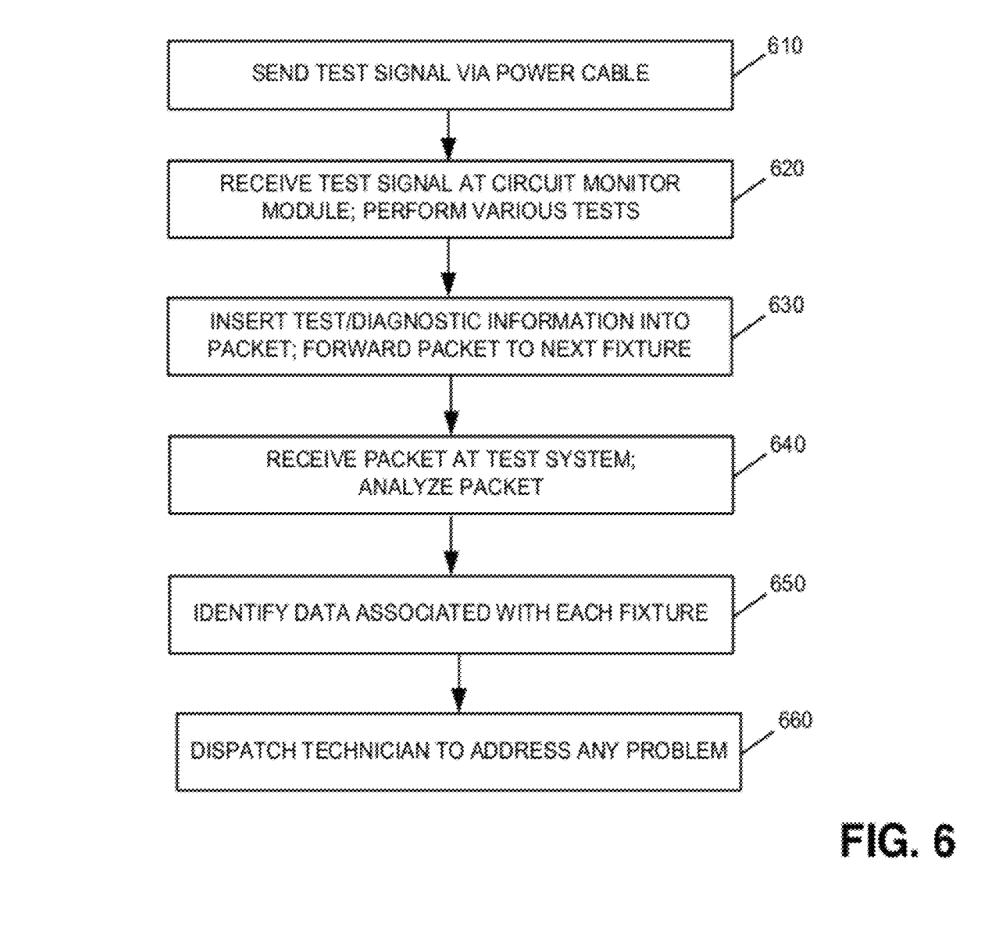
FIG. 6 is a flow diagram illustrating processing associated with the system of FIG. 1 in accordance with an exemplary embodiment.

FIG. 6 illustrates exemplary processing associated with testing system 100. Processing may begin with test system 110 initiating a test of light fixtures 120, sign 130 and/or cable 140. For example, test system 110 may send a test packet or signal via power cable 140 to light fixture 120-1 (block 610). Light fixture 120-1 may receive the test packet and CM 310 may identify that the packet includes information identifying the type of tests to perform on light fixture 120-1 and/or the portion of cable 140 located between CCR 110 and light fixture 120-1 (block 620). For example, CM 310 may receive the packet and determine that the packet indicates that a test on the secondary winding 324 of transformer 320 should be performed. In this case, CM 310 may measure the voltage and current of secondary winding 324 to identify whether a short exists in isolation transformer 320.

CM 310 may also determine that the test packet indicates that a load test should be performed for light fixture 120. In this case, CM 310 may determine whether a load 340 exists on the secondary side of isolation transformer 320. As discussed above, if no load exists, CM 310 may determine that a bulb failure has occurred.

CM 310 may further perform a Megger test to measure the resistance value associated with the segment of the cable 140 between CCR 110 and lighting fixture 120-1. Such a test may enable personnel at a central monitoring facility (e.g., test system 110) determine whether insulation and/or connection problems exist in the segment of cable 140 connecting test system 110 and light fixture 120-1.

After performing the various tests/measurements described above, CM 310 may insert the test results into the packet received from CCR 110 (block 630). For example, processor 410 may insert the measurement data (e.g., the measured voltage and/or current associated with secondary winding 324, the information associated with load 340, such as bulb failure information, resistance values associated with cable 140, etc.) into a payload of the packet at a location starting at the beginning of the payload portion of the packet. Processor 410 may forward the packet to the next light fixture in the serial circuit (block 630). In this example, processor 410 may forward the packet via communication interface 460 to light fixture 120-2.

Processing may continue in this manner with each light fixture 120 inserting test result data into the payload of the packet. By inserting the test data into the packet at a location adjacent the previous test data, test system 110 will be able to identify test data associated with each particular segment of cable 140 and light fixture 120. This enables the central monitoring system to easily identify problem locations on system 100. If a light fixture 120 is not operating properly, null data or some other type of data may be inserted into the data packet that will be recognized by the central monitoring system as an alert or trouble associated with the particular light fixture.

Assume that the test packet has reached sign 130. CM 310 within sign 130 may perform similar processing associated with performing tests on sign 130 and/or cable 140 and forward the packet back to test system 110. Test system 110 may receive the test packet and analyze the content of the test packet (block 640). For example, test system 110 may identify data associated with each particular light fixture 120 and each segment of cable 140 (block 650).

Test system 110 and/or a technician associated with monitoring system 100 may then dispatch personnel to a particular portion of system 100 that may have a problem (block 660). For example, if the returned test data indicates that fixture 120-3 has a burned out bulb, an electrician may be dispatched to light fixture 120-3 to replace the bulb. Similarly, if the test data indicates an insulation resistance problem associated with the portion of cable 140 located between light fixture 120-1 and 120-2, an electrician/technician may be dispatched to that portion of cable 140 to identify the problem.

In the implementation described above, a test signal or packet was forwarded from test system 110 to each of light fixtures 120 and sign 130, and each of fixtures 120 and sign 130 inserted its test result data into the packet before forwarding on the packet. Since the test signal/packet is forwarded on serial cable 140, each of light fixtures 120 receives the test initiation signal in a serial manner and performs its testing upon receipt of the test initiation signal.

In some implementations, upon receipt of a test initiation signal, such as a Megger test signal, each CM 310 may automatically measure insulation values associated with a Megger test. Each CM 310 may also relay resistance/Megger values and/or other test values to the central monitoring system on the carrier (i.e., cable 140) in a next shift cycle. For example, each CM 310 may interpose or multiplex information (e.g., a Megger value) associated with the Megger test on cable 140, which is also simultaneously carrying power for fixtures 120 and sign 130, and forward the information (e.g., Megger value) on cable 140. In this case, the central monitoring system (e.g., test system 110) may identify the particular fixture 120 associated with the data on cable 140 based on a time in which the data is received. That is, the data for each of fixtures 120 and/or portions of cable 140 may be received in consecutive shift cycles so that test system 110 identifies the test data associated with each particular fixture 120 or portion of cable 140 based on the order or time in which the data is received. In other implementations, each fixture 120 or sign 130 may tag its data with an identification number that is recognized by test system 110.

In some implementations, test system 110 may perform TDR testing in addition to, or as an alternative to, the testing described above. For example, test system 110 may include a TDR program that analyzes characteristics of electrical lines, such as cable 140, as well as detects discontinuities or faults in connectors, circuit boards or other electrical paths, such as components in fixtures 120 or sign 130. In an exemplary implementation, the TDR at test system 110 may transmit a test pulse/signal along cable 140 to initiate the TDR test. In some implementations, the test signal/pulse for the TDR test may be a communication signal that indicates to light fixture 120-1 that a TDR test is to commence. If the device/TDR that transmitted a signal/pulse receives a return pulse, this may indicate that cable 140, fixtures 120 and/or sign 130 include a fault or other discontinuity, as described in more detail below. In addition, each CM 310 in lighting fixture 120 and sign 130 may forward information identifying the reflected pulse level received by the particular CM 310 for analysis by test system 110, as also described in detail below.

Figure 7:
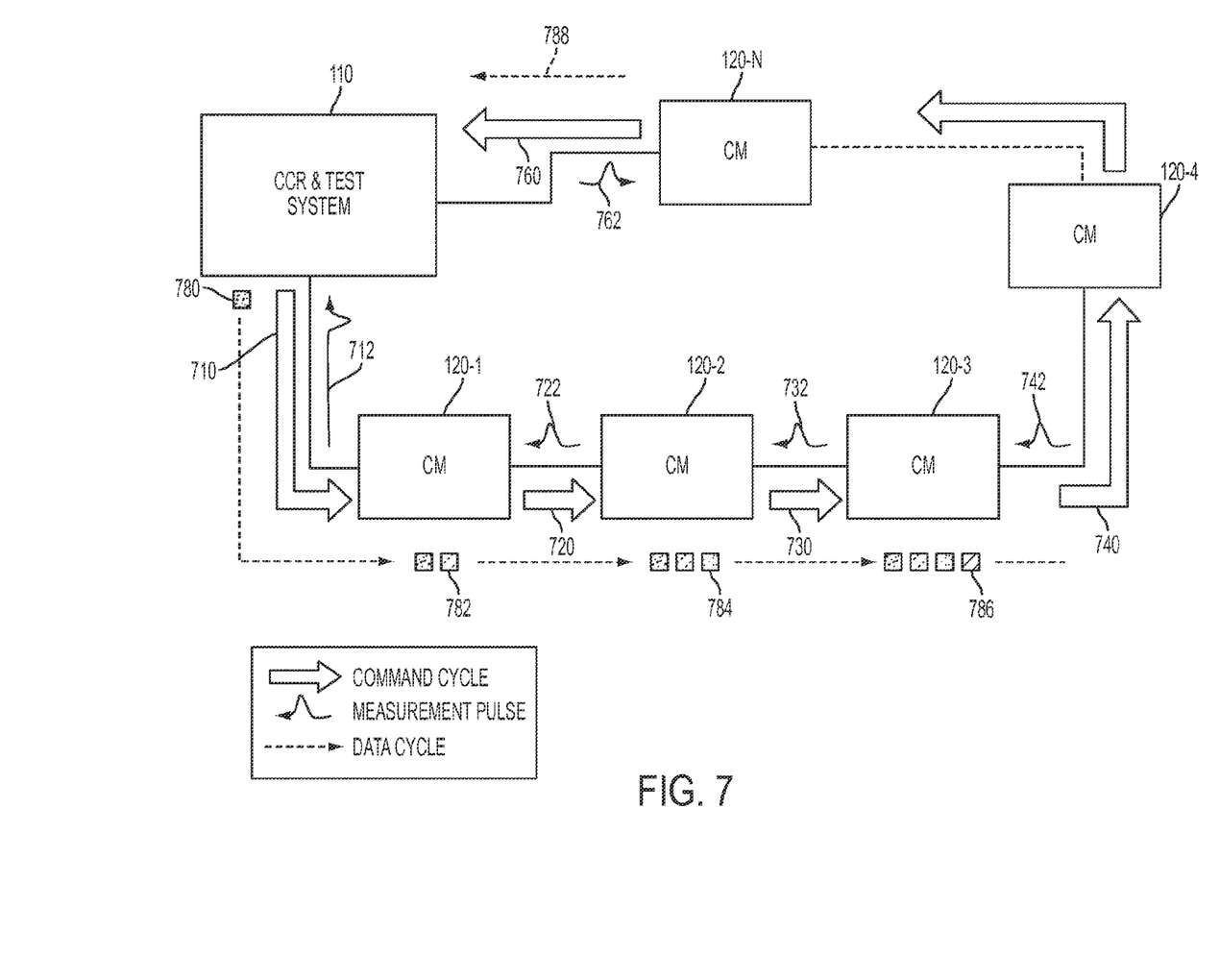
FIG. 7 illustrates an exemplary test of the system of FIG. 1 using time domain reflectometry.

For example, FIG. 7 illustrates use of TDR to test components of system 100. Referring to FIG. 7, test system 110 may send a test command/initiation signal 710 on cable 140 to light fixture 120-1. The signal received at fixture 120-1 may be reflected back to test system 110, as indicated by reflected signal 712 in FIG. 7. When a reflected pulse is received by the transmitting device (i.e., test system 110 in this example), this may indicate a fault or other discontinuity. Test system 110 may measure the amplitude of the reflected signal.

After CM 310 at fixture 120-1 (labeled CM 120-1 in FIG. 7) receives the TDR test command/initiation signal, CM 310 at fixture 120-1 may forward a test initiation command signal to light fixture 120-2, as illustrated by signal 720 in FIG. 7. Similar to the discussion above regarding the portion of cable 140 located between test system 110 and fixture 120-1, if cable 140 includes a fault located between fixtures 120-1 and 120-2, a reflected pulse (e.g., reflected pulse 722) may be transmitted back and measured at CM 310 in fixture 120-1. In this case, the time from when the test signal was transmitted from fixture 120-1 until the reflected signal is received back at fixture 120-1 may be used to identify the location of the fault. That is, the signal propagation speed of the test signal and the round trip time from the time that the test pulse was transmitted until the reflected pulse was received may be used to determine an approximate location of the fault (i.e., between fixtures 120-1 and 120-2 in this example).

Each CM 310 may forward the TDR test command/initiation signal to the next light fixture 120 and/or sign 130 located downstream of the receiving CM 310. For example, CM 310 in light fixture 120-2 (labeled CM 120-2) forwards signal 730 to light fixture 120-3, CM 310 in light fixture 120-3 forwards signal 740 to light fixture 120-1 up through light fixture 120-N, in which CM 310 forwards signal 760 to test system 110 to complete the loop.

Similar to the discussion above, each light fixture 120 that transmits a test signal may also receive a reflected pulse (e.g., reflected pulses 712, 722, 732, 742, . . . 762 illustrated in FIG. 7). Each CM 310 in the light fixture 120/sign 130 may measure the amplitude of the reflected pulse as described above with respect to CM 310 in light fixture 120-1. Test system 110 and CMs 310 in light fixtures 120 and sign 130 may forward information associated with the measured reflected pulse level to test system 110 for analysis.

For example, in one implementation, when test system 110 receives reflected pulse 712 from light fixture 120-1, test system 110 may generate a data packet and insert amplitude information associated with the reflected pulse into the data packet for transmission along cable 140 to light fixture 120-1, as indicated by packet 780 in FIG. 7. When light fixture 120-1 receives packet 780, CM 310 in light fixture 120-1 inserts or packs the payload of data packet 780 with the amplitude information associated with reflected pulse 722 and forwards the data packet to light fixture 120-1, as indicated by packet 782. When light fixture 120-2 receives packet/signal 782, CM 310 in light fixture 120-2 similarly inserts/packs the payload of data packet 782 with the amplitude information associated with reflected pulse 732 and forwards packet 784 along cable 140. Processing continues in this manner with each light fixture 120/sign 130 inserting amplitude information associated with the reflected pulse that it received during the TDR test into the data packet until CM 120-N forwards data packet 788 to test system 110.

Test system 110 receives packet 788 and uses the payload information to identify faults along cable 140. For example, packet 788 may include data associated with reflected pulses received/measured by each node (e.g., light fixture 120 or sign 130 in system 110). The differential amplitude of each reflected pulse may used by test system 110 to recognize the location of the fault and its severity versus other baseline reflections previously recorded. Other types of discontinuities and problems in cable 140, fixtures 120 and sign 130 (e.g., open circuits, bad connections, etc.) may also be detected in a similar manner. In some instances, the amplitude or magnitude of the reflected pulse/signal measured by each CM 310 may be used to further indicate the type of problem. For example, if the amplitude or magnitude of the reflected pulse is small compared to the amplitude of the test pulse, this may indicate a bad connection at one of light fixtures 120 or sign 130, as opposed to a short circuit/fault or open circuit condition. As s described above, test system 110 may decode and analyze data associated with the TDR test from each fixture 120/sign 130 in system 110 to identify faults and/or other problems.

In an exemplary implementation, test system 110 may also include logic, such as software, hardware and/or firmware to establish initial commissioned baselines for each segment and load device in system 110. That is, test system 110 may initially generate baseline test data for system 100 by testing system 100 while system 100 is known to be in a fully functional state (e.g., when system 100 is known to include no faults). Test system 110 may then store expected values/data (e.g., in memory 230, FIG. 2) associated with TDR testing when no problems exist. Test system 110 may then identify degradation of system 100 based on the changes/differential between the measured values and the baseline values stored in test system 110. Test system 110 may also identify locations of any degradation using positional addressing and relative time of data in a received packet, such as packet 788, relative to the timing of initial command pulse/test signal 710. In other implementations, packet 788 may includes tags identifying each CM 310 that analyzed the reflected pulse data. In this manner, test system 110 may identify which portion of cable 140 and/or fixture 120/sign 130 that is associated with the data in packet 788.

In some implementations, test system 110 may output information associated with testing system 100 on output device 250 (FIG. 2), such as a liquid crystal display (LCD) screen. For example, test system 110 may output diagnostic information associated with any faults/problems via an LCD screen, along with geographical location information identifying the approximate location of faults or other problems. This may allow personnel at test system 110 to dispatch technicians to the locations where the problem exists without spending a significant amount of time trying to identify the location of the problem/fault.

As discussed above, CM 310 may include grounding relay 450. In one implementation, grounding relay 450 may detect a lightning strike or other voltage surge on the particular light fixture in which grounding relay 450 is located and immediately short that particular light fixture 120 to ground. For example, assume that light fixture 120-8 is hit by lightning and a voltage spike is imparted to cable 140 at light fixture 120-8. In this case, grounding relay 450 may sense that the voltage on cable 140 is greater than a predetermined amount and trip grounding relay 450 so that isolation transformer 320 in light fixture 120-8 is grounded. In this manner, the voltage spike will not cascade via cable 140 to other downstream light fixtures 120.

In addition, in some implementations, if test system 110 detects a problem in one of light fixtures 120, test system 110 may send a control signal via cable 140 to trip the grounding relay 450 of the light fixture 120 that may have a problem.

In the embodiments described herein, test system 110 interposes or multiplexes data communications or test signals over cable 140, which is simultaneously providing power to fixtures 120 and sign 130. In other embodiments, test system 110 may initiate testing via cable 140 during brief interruptions in which power cable 140 is not supplying power to fixtures 120 and/or sign 130. For example, CCR and test system 110 may interrupt current for very brief periods of time (e.g., a few microseconds) on cable 140. During these brief interruptions, test system 110 may transmit test initiation signals over cable 140. Since the interruptions are very short, light fixtures 120 and sign 130 may experience no adverse effects. That is, the interruption of power will not cause any flickering of the light bulbs/signs. In still other embodiments, test system 110 may use TDR testing to test various electrical characteristics of cable 140, as well as light fixtures 120/sign 130.

In addition, in the embodiments described above, test system 110 receives returned test data from light fixtures 120 and sign 130. In other implementations, light fixtures 120 and/or sign 130 may transmit the test data back to a central monitoring facility via, for example, low frequency wireless signals via a wireless mesh network. In still other implementations, a technician may tap into one of fixtures 120 or sign 130 and run diagnostics via an application programming interface (API) or other interface provided by the fixture 120 or sign 130.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments.

For example, implementations described above refer to a system 100 that includes serially connected light fixtures/signs. It should be understood that system 100 may include other types of electrical devices that may be tested in a similar manner. That is, system 100 may include any type of electrical devices and/or electrical loads that may be tested in the manner described above.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. In a system including a plurality of load devices, a method comprising:
   outputting a test initiation command over a power supply cable to a first one of the plurality of load devices, the test initiation command including information identifying a type of test to perform;
   receiving, at the first load device, the test initiation command;
   identifying, at the first load device, the type of test to perform;
   testing the first load device based on the identified type of test;
   generating first test data for the first load device;
   inserting the first test data into a data packet;
   forwarding the data packet to another load device; and
   repeating the inserting and forwarding for each of the plurality of load devices.

2. The method of claim 1, wherein the load devices comprise light fixtures, the method further comprising:
   forwarding, by a last one of the plurality of light fixtures, the data packet to a test monitoring system.

3. The method of claim 2, further comprising:
analyzing, by the test monitoring system, the data packet to identify parameters associated with each of the light fixtures.

4. The method of claim 3, further comprising:
identifying, by the test monitoring system, data associated with each of the plurality of light fixtures based on a location of the data within the data packet.

5. The method of claim 1, wherein the first test data comprises resistance values associated with a power cable providing power to the first load device.

6. The method of claim 5, wherein the load devices comprise light fixtures, and wherein the first test data further comprises information associated with operating conditions of a bulb included in the first light fixture.

7. The method of claim 6, wherein the first test data further comprises information associated with an operating condition of a secondary transformer coil providing power to the first light fixture.

8. The method of claim 1, wherein the first test data comprises reflected pulse measurement data associated with the power cable providing power to the load devices.

9. A system, comprising:
a plurality of light fixtures;
a constant current regulator; and
a cable serially connecting the constant current regulator to each of the plurality of light fixtures,
wherein each of the plurality of light fixtures includes a circuit monitor module configured to:
  receive a test initiation signal or command transmitted via the cable, the test initiation signal or command including information identifying a type of test to perform,
  perform one or more tests in response to receiving the test initiation signal,
  generate test data in accordance with the identified type of test,
  insert the test data into a data packet, and
  forward the data packet to another one of the plurality of light fixtures via the cable.

10. The system of claim 9, further comprising:
a test device configured to transmit the test initiation signal or command via the cable.

11. The system of claim 10, wherein the test device is further configured to:
receive the test data inserted into the data packet, and
identify a location of a problem in the system based on the received test data.

12. The system of claim 9, further comprising a time domain reflectometer configured to test the cable, wherein each circuit monitor module in each of the plurality of light fixtures is further configured to:
transmit a test pulse or the test initiation command on the cable,
forward the test pulse or test initiation command to a downstream light fixture,
measure a reflected pulse, and
insert information associated with an amplitude of the reflected pulse in the data packet.

13. The system of claim 12, further comprising:
a data analysis device configured to:
  receive the data packet, and
  identify a fault or other problem in the system based on information stored in the data packet.

14. The system of claim 9, wherein each of the circuit modules is further configured to:
forward test data generated in response to a second test initiation signal via the cable in successive shift cycles.

15. The system of claim 9, wherein each of the plurality of light fixtures further comprises:
an isolation transformer, and
a ground relay configured to sense a voltage or current spike and ground the isolation transformer.

16. The system of claim 9, wherein the test initiation signal or command is transmitted via the cable concurrently with power being transmitted via the cable to power the plurality of light fixtures.

17. The system of claim 9, wherein the test initiation signal or command is transmitted during brief interruptions when no power is being transmitted via the cable.

18. In a system including a plurality of light fixtures, a method comprising:
outputting a test initiation signal over a power supply cable supplying power to each of the plurality of light fixtures to a first one of the plurality of light fixtures;
receiving, at the first light fixture, the test initiation signal;
performing a test at the first light fixture in response to receiving the test initiation signal;
generating, by the first light fixture, first test data associated with the test;
inserting the first test data into a data packet;
forwarding, by the first light fixture, the data packet via the power supply cable to another one of the plurality of light fixtures; and
repeating the inserting and forwarding for each of the plurality of light fixtures.

19. The method of claim 18, further comprising:
receiving, at a central monitoring device, test data associated with each of the plurality of light fixtures; and
identifying the test data for each of the plurality of light fixtures based on a tag included with the test data, a time in which the test data was received or a cycle in which the test data was received.

20. The method of claim 18, wherein the test comprises an insulation resistance test.

21. The method of claim 18, wherein the test comprises a test of the power supply cable, and wherein the first test data comprises information identifying an amplitude of a reflected signal received by the first light fixture.

* * * * *